United States Patent
Inatomi et al.

(10) Patent No.: US 10,784,111 B2
(45) Date of Patent: Sep. 22, 2020

(54) PLATING METHOD, PLATING APPARATUS AND RECORDING MEDIUM

(71) Applicant: Tokyo Electron Limited, Tokyo (JP)

(72) Inventors: Yuichiro Inatomi, Kumamoto (JP); Takashi Tanaka, Kumamoto (JP); Kazutoshi Iwai, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/345,385

(22) PCT Filed: Aug. 29, 2017

(86) PCT No.: PCT/JP2017/030995
§ 371 (c)(1),
(2) Date: Apr. 26, 2019

(87) PCT Pub. No.: WO2018/079056
PCT Pub. Date: May 3, 2018

(65) Prior Publication Data
US 2019/0267242 A1    Aug. 29, 2019

(30) Foreign Application Priority Data
Oct. 27, 2016  (JP) .................................. 2016-210919

(51) Int. Cl.
C23C 18/16   (2006.01)
C23C 18/28   (2006.01)
(Continued)

(52) U.S. Cl.
CPC ........ H01L 21/288 (2013.01); C23C 18/1619 (2013.01); C23C 18/1675 (2013.01);
(Continued)

(58) Field of Classification Search
CPC ............ C23C 18/1603; C23C 18/1605; C23C 18/1607; C23C 18/1608; C23C 18/1639; C23C 18/1642
See application file for complete search history.

(56) References Cited

U.S. PATENT DOCUMENTS 3,640,789 A * 2/1972 Hepfer .................. H05K 3/182
156/92
3,769,061 A * 10/1973 Dutkewych ............. C23C 18/22
427/307

FOREIGN PATENT DOCUMENTS

| JP | 2001-335952 A | 12/2001 |
| JP | 2009-249679 A | 10/2009 |
| JP | 2011-174106 A | 9/2011 |

OTHER PUBLICATIONS

International Search Report for PCT/JP2017/030995 dated Oct. 24, 2017.

* cited by examiner

Primary Examiner — Dah-Wei D. Yuan
Assistant Examiner — Nga Leung V Law
(74) Attorney, Agent, or Firm — Pearne & Gordon LLP

(57) ABSTRACT

A substrate W having a non-plateable material portion 31 and a plateable material portion 32 formed on a surface thereof is prepared, and then, a catalyst is imparted selectively to the plateable material portion 32 by supplying a catalyst solution N1 onto the substrate W. Thereafter, a plating layer 35 is selectively formed on the plateable material portion 32 by supplying a plating liquid M1 onto the substrate W. A pH of the catalyst solution N1 is previously adjusted such that the plating layer 35 is suppressed from being precipitated on the non-plateable material portion 31 while being facilitated to be precipitated on the plateable material portion 32.

3 Claims, 7 Drawing Sheets

(51) Int. Cl.
*C23C 18/30* (2006.01)
*C23C 18/18* (2006.01)
*H01L 21/288* (2006.01)

(52) U.S. Cl.
CPC ............ *C23C 18/18* (2013.01); *C23C 18/285* (2013.01); *C23C 18/30* (2013.01)

PLATING METHOD, PLATING APPARATUS AND RECORDING MEDIUM

CROSS-REFERENCE TO RELATED APPLICATION

This Application is a U.S. national phase application under 35 U.S.C. § 371 of PCT Application No. PCT/JP2017/030995 filed on Aug. 29, 2017, which claims the benefit of Japanese Patent Application No. 2016-210919 filed on Oct. 27, 2016, the entire disclosures of which are incorporated herein by reference.

TECHNICAL FIELD

The various aspects and embodiments described herein pertain generally to a plating method, a plating apparatus and a recording medium.

BACKGROUND

Recently, as miniaturization and three-dimension of semiconductor devices are required, it is required to improve processing accuracy by etching when processing the semiconductor devices. As one way to improve the processing accuracy by etching, it is required to improve accuracy of a hard mask (HM) for dry etching which is formed on a substrate.

Patent Document 1: Japanese Patent Laid-open Publication No. 2009-249679

In general, however, there are many restrictions for a material of the hard mask. For example, the material of the hard mask needs to have high adhesivity to a substrate and a resist, needs to have high resistance against a heat treatment, and an etching processing, and, also, needs to be easily removed. For the reason, conventionally, only a limited material such as SiN (silicon nitride) or TiN (titanium nitride) has been used as the material of the hard mask.

In view of this, the present inventors have examined providing a film of $SiO_2$ (silicon oxide) or the like and a film of SiN (silicon nitride) or the like on a substrate; applying a catalyst such as Pd on the substrate to selectively apply the catalyst on the SiN film; and forming a plating layer only on the SiN film by using this catalyst. In this case, as the plating layer formed on the SiN film can be used as the hard mask, it is possible to select various kinds of materials as the plating layer.

In the process of imparting the catalyst such as Pd, however, the catalyst uniformly adheres not only to the SiN film but also to the SiO film where the plating layer is not intended to be formed. In this case, adhesivity between the catalyst and the SiO film is weaker than adhesivity between the catalyst and the SiN film. Accordingly, the catalyst is separated from the SiO film by the time when a plating processing is performed, and, as a result, the catalyst is imparted selectively only to the SiN film.

In case of using a conventional method, however, it has been difficult to perform a processing on improvement of the adhesivity between the catalyst and the SiN film after the catalyst is imparted and before performing the plating processing. That is, if the processing on the improvement of the adhesivity between the catalyst and the SiN film is performed, the adhesivity between the catalyst and the SiO film is also improved.

SUMMARY

In view of the foregoing, exemplary embodiments provide a plating method, a plating apparatus capable of allowing, when imparting a catalyst, the catalyst to be attached selectively to a plateable material portion from the beginning, and a recording medium therefor.

In an exemplary embodiment, a plating method includes preparing a substrate having a non-plateable material portion and a plateable material portion formed on a surface thereof; imparting a catalyst selectively to the plateable material portion by supplying a catalyst solution onto the substrate; and forming a plating layer selectively on the plateable material portion by supplying a plating liquid onto the substrate. A pH of the catalyst solution is previously adjusted such that the plating layer is suppressed from being precipitated on the non-plateable material portion while being facilitated to be precipitated on the plateable material portion.

In another exemplary embodiment, a plating apparatus includes a substrate holding unit configured to hold a substrate having a plateable material portion and a non-plateable material portion on a surface thereof; a catalyst imparting unit configured to impart a catalyst selectively to the plateable material portion by supplying a catalyst solution onto the substrate; and a plating liquid supply unit configured to form a plating layer selectively on the plateable material portion by supplying a plating liquid onto the substrate. A pH of the catalyst solution is previously adjusted such that the plating layer is suppressed from being precipitated on the non-plateable material portion while being facilitated to be precipitated on the plateable material portion.

According to the exemplary embodiments as stated above, in the process of imparting the catalyst, the catalyst can be selectively attached to the plateable material portion from the beginning.

DETAILED DESCRIPTION

Hereinafter, exemplary embodiments will be explained with reference to the accompanying drawings.

<Configuration of Plating Apparatus>

Figure 1:
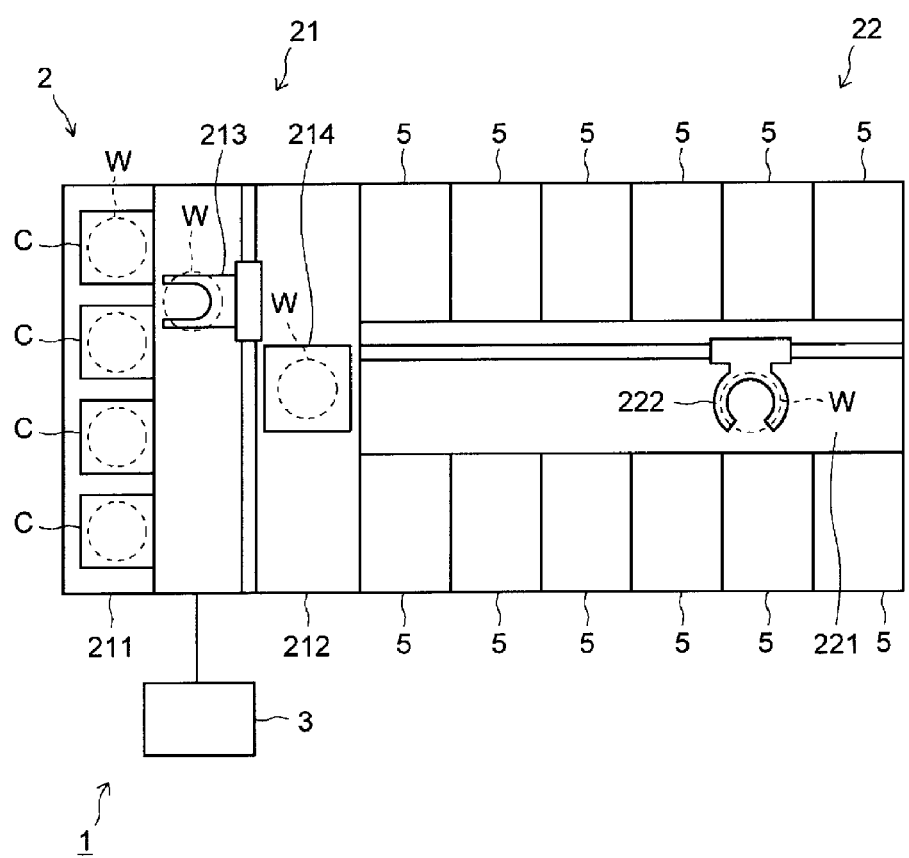
FIG. 1 is a schematic plan view illustrating a configuration of a plating apparatus and a plating unit provided in the plating apparatus.

Referring to FIG. 1, a configuration of a plating apparatus according to an exemplary embodiment will be explained.

FIG. 1 is a schematic diagram illustrating the configuration of the plating apparatus according to the exemplary embodiment.

As depicted in FIG. 1, a plating apparatus 1 according to the present exemplary embodiment is equipped with a plating unit 2 and a controller 3 configured to control an operation of the plating unit 2.

The plating unit 2 is configured to perform various processings on a substrate. The various processings performed by the plating unit 2 will be discussed later.

The controller 3 is implemented by, for example, a computer, and includes an operation controller and a storage unit. The operation controller is implemented by, for example, a CPU (Central Processing Unit) and is configured to control an operation of the plating unit 2 by reading and executing the programs stored in the storage unit. The storage unit is implemented by a memory device such as, but not limited to, a RAM (Random Access Memory), a ROM (Read Only Memory) or a hard disk, and stores thereon programs for controlling various processings performed in the plating unit 2. Further, the programs may be recorded in a computer-readable recording medium, or may be installed from the recording medium to the storage unit. The computer-readable recording medium may be, for example, a hard disc (HD), a flexible disc (FD), a compact disc (CD), a magnet optical disc (MO), or a memory card. Stored in the recording medium is a program which, when executed by a computer for controlling an operation of the plating apparatus 1, allows the computer to control the plating apparatus 1 to perform a plating method to be described later.

<Configuration of Plating Unit>

Referring to FIG. 1, a configuration of the plating unit 2 will be discussed. FIG. 1 is a schematic plan view illustrating the configuration of the plating unit 2.

The plating unit 2 includes a carry-in/out station 21 and a processing station 22 which is provided adjacent to the carry-in/out station 21.

The carry-in/out station 21 is equipped with a placing section 211 and a transfer section 212 which is provided adjacent to the placing section 211.

In the placing section 211, transfer containers (hereinafter, referred to as "carriers C") for accommodating therein a plurality of substrates W horizontally are placed.

The transfer section 212 is equipped with a transfer device 213 and a delivery unit 214. The transfer device 213 is provided with a holding mechanism configured to hold a substrate W and is configured to be movable horizontally and vertically and pivotable around a vertical axis.

The processing station 22 includes plating devices 5. In the present exemplary embodiment, the number of the plating devices 5 belonging to the processing station 22 is two or more. However, only one plating device 5 may be provided. The plating devices 5 are arranged at both sides of a transfer path 221 which is extended in a preset direction.

A transfer device 222 is provided in the transfer path 221. The transfer device 222 is equipped with a holding mechanism configured to hold the substrate W and is configured to be movable horizontally and vertically and pivotable around a vertical axis.

In the plating unit 2, the transfer device 213 of the carry-in/out station 21 is configured to transfer the substrate W between the carrier C and the delivery unit 214. To elaborate, the transfer device 213 takes out the substrate W from the carrier C which is placed in the placing section 211, and places the substrate W in the delivery unit 214. Further, the transfer device 213 takes out the substrate W which is placed in the delivery unit 214 by the transfer device 222 of the processing station 22, and accommodates the substrate W back into the carrier C on the placing section 211.

In the plating unit 2, the transfer device 222 of the processing station 22 is configured to transfer the substrate W between the delivery unit 214 and the plating device 5 and between the plating device 5 and the delivery unit 214. To elaborate, the transfer device 222 takes out the substrate W which is placed in the delivery unit 214 and then carries the substrate W into the plating device 5. Further, the transfer device 222 takes out the substrate W from the plating device 5 and places the substrate W in the delivery unit 214.

<Configuration of Plating Device>

Figure 2:
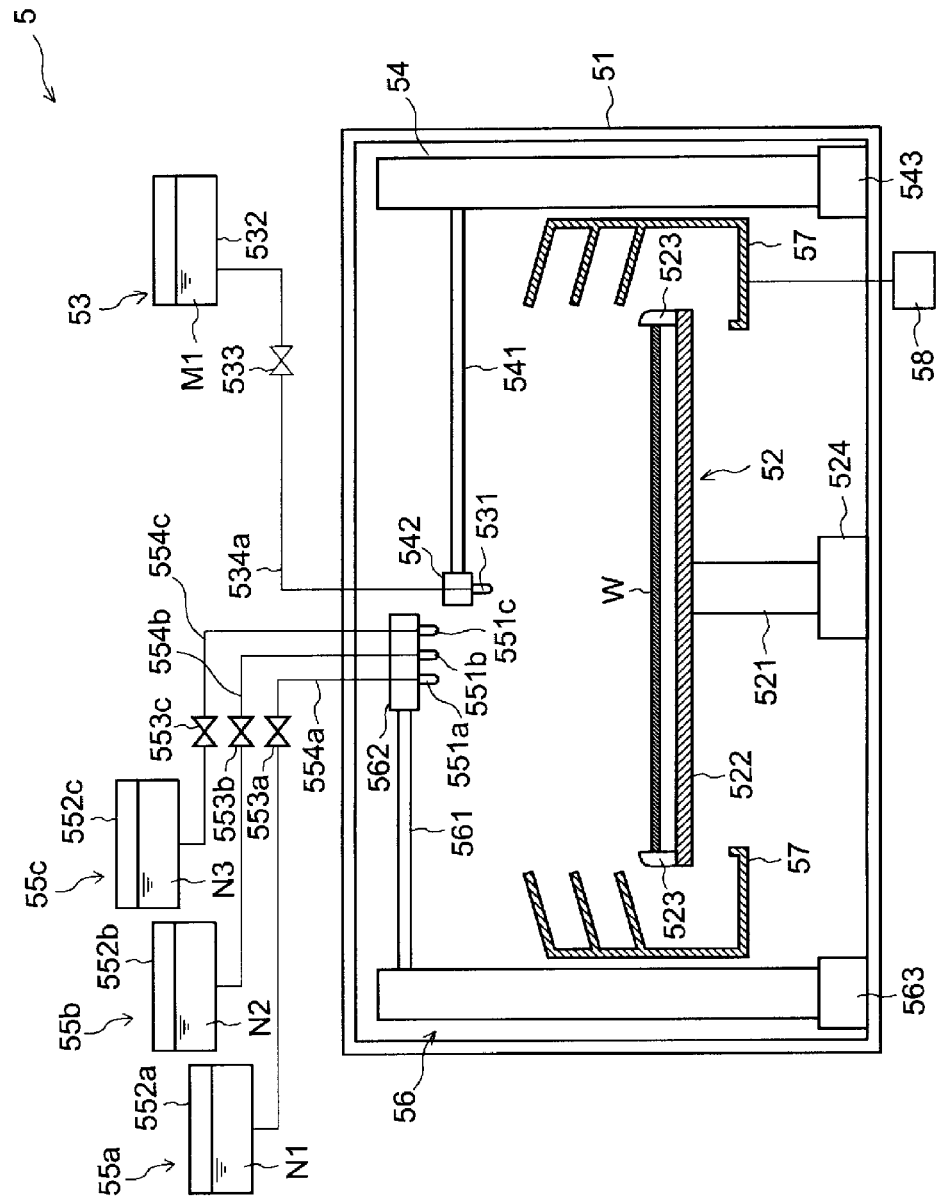
FIG. 2 is a schematic cross sectional view illustrating a configuration of a plating device belonging to the plating unit shown in FIG. 1.

Referring to FIG. 2, a configuration of the plating device 5 will be explained. FIG. 2 is a schematic cross sectional view illustrating the configuration of the plating device 5.

The plating device 5 is configured to perform a plating processing on a substrate W having a non-plateable material portion 31 and a plateable material portion 32 on a surface thereof, and configured to form a plating layer 35 selectively on the plateable material portion (see FIG. 3 to FIG. 7D to be described later). A substrate processing performed by the plating device 5 includes a catalyst imparting processing and an electroless plating processing at least. However, the substrate processing may further include processings other than the catalyst imparting processing and the plating processing.

The plating device 5 is configured to perform a substrate processing including the aforementioned electroless plating processing. The plating device 5 includes a chamber 51; a substrate holding unit 52 provided within the chamber 51 and configured to hold the substrate W; and a plating liquid supply unit 53 configured to supply a plating liquid M1 to the substrate W held by the substrate holding unit 52.

The substrate holding unit 52 includes a rotation shaft 521 extended in a vertical direction within the chamber 51; a turntable 522 provided at an upper end portion of the rotation shaft 521; a chuck 523 provided on an outer peripheral portion of a top surface of the turntable 522 and configured to support an edge portion of the substrate W; and a driving unit 524 configured to rotate the rotation shaft 521.

The substrate W is supported by the chuck 523 to be horizontally held by the turntable 522 while being slightly spaced apart from the top surface of the turntable 522. In the present exemplary embodiment, a mechanism of holding the substrate W by the substrate holding unit 52 is of a so-called mechanical chuck type in which the edge portion of the substrate W is held by the chuck 523 which is configured to be movable. However, a so-called vacuum chuck type of vacuum-attracting a rear surface of the substrate W may be used instead.

A base end portion of the rotation shaft 521 is rotatably supported by the driving unit 524, and a leading end portion of the rotation shaft 521 sustains the turntable 522 horizontally. If the rotation shaft 521 is rotated, the turntable 522 placed on the upper end portion of the rotation shaft 521 is rotated, and, as a result, the substrate W which is held by the turntable 522 with the chuck 523 is also rotated.

The plating liquid supply unit 53 is equipped with a nozzle 531 configured to discharge the plating liquid M1 onto the substrate W held by the substrate holding unit 52; and a plating liquid supply source 532 configured to supply the plating liquid M1 to the nozzle 531. The plating liquid M1 is stored in a tank of the plating liquid supply source 532, and the plating liquid M1 is supplied into the nozzle 531 from the plating liquid supply source 532 through a supply passageway 534a which is equipped with a flow rate controller such as a valve 533.

The plating liquid M1 is an autocatalytic (reduction) plating liquid for electroless plating. The plating liquid M1 contains a metal ion such as a cobalt (Co) ion, a nickel (Ni) ion, a tungsten (W) ion; and a reducing agent such as hypophosphorous acid or dimethylamineborane. Further, in the autocatalytic (reduction) electroless plating, the metal ion in the plating liquid M1 is reduced by the electrons emitted in an oxidation reaction of the reducing agent in the plating liquid M1 to be precipitated as a metal, so that a metal film (plating film) is formed. The plating liquid M1 may further contain an additive or the like. The metal film (plating film) formed by the plating processing with the plating liquid M1 may be, by way of non-limiting example, CoB, CoP, CoWP, CoWB, CoWBP, NiWB, NiB, NiWP, NiWBP, or the like. P in the metal film (plating film) is originated from the reducing agent (e.g., hypophosphorous acid) containing P, and B in the plating film is originated from the reducing agent (e.g., dimethylamineborane) containing B.

The nozzle 531 is connected to a nozzle moving device 54. The nozzle moving device 54 is configured to drive the nozzle 531. The nozzle moving device 54 includes an arm 541, a moving body 542 which is configured to be movable along the arm 541 and has a driving mechanism embedded therein; and a rotating/elevating device 543 configured to rotate and move the arm 541 up and down. The nozzle 531 is provided at the moving body 542. The nozzle moving device 54 is capable of moving the nozzle 531 between a position above a center of the substrate W held by the substrate holding unit 52 and a position above a periphery of the substrate W, and is also capable of moving the nozzle 531 up to a stand-by position outside a cup 57 to be described later when viewed from the top.

Within the chamber 51, there are arranged a catalyst solution supply unit (catalyst imparting unit) 55a, a cleaning liquid supply unit 55b and a rinse liquid supply unit 55c configured to supply a catalyst solution N1, a cleaning liquid N2 and a rinse liquid N3 onto the substrate W held by the substrate holding unit 52, respectively.

The catalyst solution supply unit (catalyst imparting unit) 55a includes a nozzle 551a configured to discharge the catalyst solution N1 onto the substrate W held by the substrate holding unit 52; and a catalyst solution supply source 552a configured to supply the catalyst solution N1 to the nozzle 551a. The catalyst solution N1 is stored in a tank of the catalyst solution supply source 552a, and the catalyst solution N1 is supplied to the nozzle 551a from the catalyst solution supply source 552a through a supply passageway 554a which is provided with a flow rate controller such as a valve 553a.

The cleaning liquid supply unit 55b includes a nozzle 551b configured to discharge the cleaning liquid N2 onto the substrate W held by the substrate holding unit 52; and a cleaning liquid supply source 552b configured to supply the cleaning liquid N2 to the nozzle 551b. The cleaning liquid N2 is stored in a tank of the cleaning liquid supply source 552b, and the cleaning liquid N2 is supplied to the nozzle 551b from the cleaning liquid supply source 552b through a supply passageway 554b which is provided with a flow rate controller such as a valve 553b.

The rinse liquid supply unit 55c includes a nozzle 551c configured to discharge the rinse liquid N3 onto the substrate W held by the substrate holding unit 52; and a rinse liquid supply source 552c configured to supply the rinse liquid N3 to the nozzle 551c. The rinse liquid N3 is stored in a tank of the rinse liquid supply source 552c, and the rinse liquid N3 is supplied to the nozzle 551c from the rinse liquid supply source 552c through a supply passageway 554c which is provided with a flow rate controller such as a valve 553c.

The catalyst solution N1 contains a metal ion having catalytic activity to the oxidation reaction of the reducing agent in the plating liquid M1. In the electroless plating processing, in order for precipitation of the metal ion in the plating liquid M1 to be started, an initial film surface (that is, a plating target surface of the substrate) needs to have sufficient catalytic activity to the oxidation reaction of the reducing agent in the plating liquid M1. As an example, such a catalyst may include, by way of example, but not limitation, an iron group element (Fe, Co, Ni), a platinum metal element (Ru, Rh, Pd, Os, Ir, Pt), Cu, Ag or Au. The metal film having the catalytic activity is formed through a replacement reaction. In the replacement reaction, a component forming the plating target surface of the substrate serves as the reducing agent, and the metal ion (e.g., Pd ion) in the catalyst solution N1 is reduced to be precipitated on the plating target surface of the substrate. Further, the catalyst solution N1 may contain a metal catalyst in the form of nanoparticles. To be more specific, the catalyst solution N1 may contain a metal catalyst in the form of nanoparticles, a dispersant and an aqueous solution. The metal catalyst in the form of nanoparticles may be, by way of non-limiting example, nanoparticle-shaped palladium (Pd). Further, the dispersant serves to allow the metal catalyst in the form of nanoparticles to be easily dispersed in the catalyst solution N1. The dispersant may be, by way of non-limiting example, polyvinylpyrrolidone (PVP).

In the present exemplary embodiment, a pH of the catalyst solution N1 is previously adjusted such that a plating layer 35 (to be described later) is suppressed from being precipitated on the non-plateable material portion 31 of the substrate W while being facilitated to be precipitated on the plateable material portion 32. To elaborate, in case that the non-plateable material portion 31 is made of a material having $SiO_2$ as a main component and the plateable material portion 32 is made of a material having SiN as a main component, the pH of the catalyst solution N1 is adjusted to be in a range from 2 to 3. In general, the pH of the catalyst solution N1 before the adjustment ranges from 4 to 6. Therefore, acidity of the catalyst solution N1 is increased than acidity before the adjustment. Further, the pH adjustment of the catalyst solution N1 may be performed by adding a pH adjuster such as sulfuric acid ($H_2SO_4$) or tetramethylammonium hydroxide (TMAH), or, hydrochloric acid ($HCl_2$) or ammonia water ($NH_4OH$) into the catalyst solution N1 within a tank of the plating liquid supply source 532 and adjusting an amount of this pH adjuster.

As an example of the cleaning liquid N2, an organic acid such as a formic acid, malic acid, a succinic acid, a citric acid or a malonic acid, or hydrofluoric acid (DHF) (aqueous solution of hydrogen fluoride) diluted to the extent that it does not corrode the plating target surface of the substrate may be used.

As an example of the rinse liquid N3, pure water may be used.

The plating device 5 includes a nozzle moving device 56 configured to move the nozzles 551a to 551c. The nozzle moving device 56 is equipped with an arm 561; a moving body 562 which is configured to be movable along the arm 561 and has a moving mechanism embedded therein; and a rotating/elevating device 563 configured to rotate and move the arm 561 up and down. The nozzles 551a to 551c are provided at the moving body 562. The nozzle moving device 56 is capable of moving the nozzles 551a to 551c between a position above the central portion of the substrate W held by the substrate holding unit 52 and a position above the peripheral portion of the substrate W, and also capable of moving the nozzles 551a to 551c up to a stand-by position outside the cup 57 to be described later when viewed from the top. In the present exemplary embodiment, though the nozzles 551a to 551c are held by the common arm, they may be configured to be held by different arms and moved independently.

The cup 57 is disposed around the substrate holding unit 52. The cup 57 is configured to receive various kinds of processing liquids (e.g., the plating liquid, the cleaning liquid, the rinse liquid, etc.) scattered from the substrate W and drain the received processing liquids to the outside of the chamber 51. The cup 57 is equipped with an elevating device 58 configured to move the cup 57 up and down.

<Structure of Substrate>

Now, a structure of the substrate in which a plating layer is to be formed by a plating method according to the present exemplary embodiment will be explained.

Figure 3:
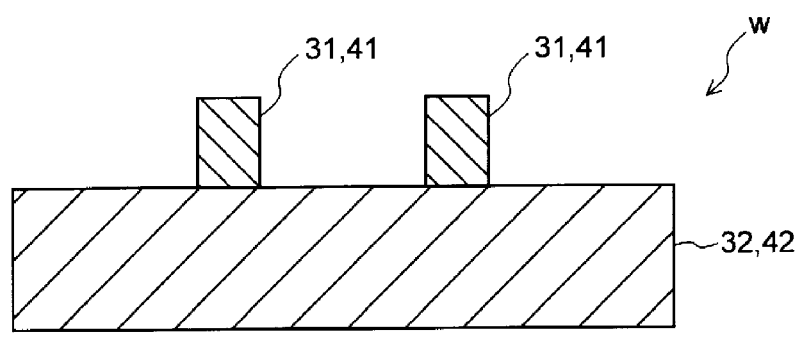
FIG. 3 is a schematic cross sectional view illustrating a structure of a substrate on which a plating layer is to be formed by a plating method according to an exemplary embodiment.

As depicted in FIG. 3, a substrate W on which a plating layer 35 is to be formed includes the non-plateable material portion 31 and the plateable material portion 32 respectively formed on a surface thereof. There is no specific limitation in the structure of the non-plateable material portion 31 and the plateable material portion 32 as long as they are exposed at the surface side of the substrate W. In the present exemplary embodiment, the substrate W includes a base member 42 made of the plateable material portion 32 and a core member 41 which is protruded from the base member 42 and is made of the non-plateable material portion 31 having a pattern shape.

The non-plateable material portion 31 is a region where a plating metal is not precipitated so that the plating layer 35 is not formed when a plating processing according to the present exemplary embodiment is performed. In the present exemplary embodiment, the non-plateable material portion 31 is made of a material containing $SiO_2$ as a main component. Further, as will be described later, the non-plateable material portion 31 may include a minute lattice defect, an impurity, or the like.

The plateable material portion 32 is a region where the plating metal is selectively precipitated so that the plating layer 35 is formed when the plating processing according to the present exemplary embodiment is performed. In the present exemplary embodiment, the plateable material portion 32 may be made of any one of (1) a material containing at least one of a $OCH_x$ group or a $NH_x$ group; (2) a metal material containing a Si-based material as a main component; (3) a material containing a catalyst metal material as a main component; and (4) a material containing carbon as a main component.

(1) In case that the material of the plateable material portion 32 includes, as the main component, the material containing at least one of the $OCH_x$ group or the $NH_x$ group, this material may be a material containing a Si—$OCH_x$ group or a Si—$NH_x$ group such as SiOCH or SiN.

(2) In case that the material of the plateable material portion 32 is the metal material containing the Si-based material as the main component, the material of the plateable material portion 32 may be, by way of non-limiting example, B-doped or P-doped poly-Si, poly-Si or Si.

(3) In case that the plateable material portion 32 includes, as the main component, the material containing the catalyst metal material as the main component, the material of the plateable material portion 32 may be, by way of example, but not limitation, Cu or Pt.

(4) In case that the plateable material portion 32 includes, as the main component, the material containing the carbon as the main component, the material of the plateable material portion 32 may be, for example, amorphous carbon.

Figure 4A:
FIG. 4A to FIG. 4E are schematic cross sectional views illustrating a manufacturing method for a substrate on which the plating layer is to be formed by the plating method according to the present exemplary embodiment.

Now, a method of fabricating the substrate W shown in FIG. 3 will be explained with reference to FIG. 4A to FIG. 4E. To produce the substrate W shown in FIG. 3, the base member 42 made of the plateable material portion 32 is first prepared, as illustrated in FIG. 4A.

Figure 4B:
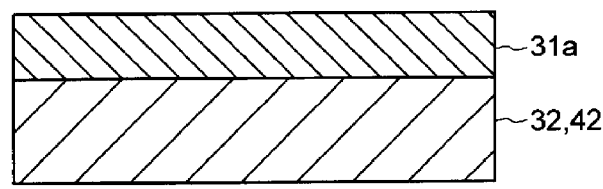

Thereafter, as depicted in FIG. 4B, a film of a material 31a, which forms the non-plateable material portion 31, is formed on the entire surface of the base member 42 made of the plateable material portion 32 by a CVD method, a PVD method or the like. The material 31a is composed of, for example, the material containing $SiO_2$ as the main component.

Figure 4C:
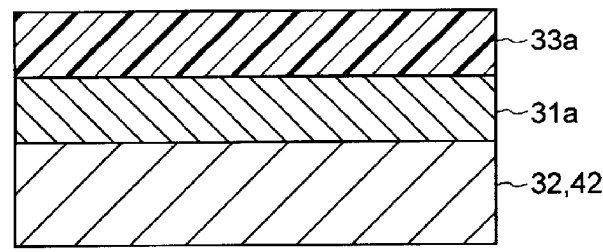
Figure 4D:
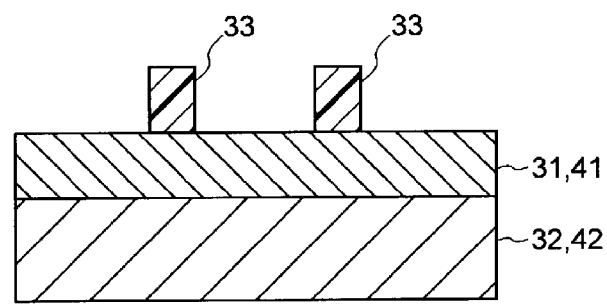

Subsequently, as illustrated in FIG. 4C, a photosensitive resist 33a is coated on the entire surface of the material 31a forming the non-plateable material portion 31 and is dried. Then, by exposing the photosensitive resist 33a through a photo mask and developing it, a resist film 33 having a required pattern is formed, as shown in FIG. 4D.

Figure 4E:
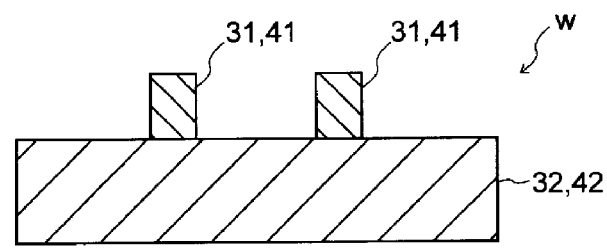

Afterwards, as depicted in FIG. 4E, the material 31a is dry-etched by using the resist film 33 as a mask. As a result, the core member 41 made of the non-plateable material portion 31 is patterned to have substantially the same shape as the pattern shape of the resist film 33. Then, by removing the resist film 33, there is obtained the substrate W having the non-plateable material portion 31 and the plateable material portion 32 formed on the surface thereof.

<Plating Method>

Now, a plating method using the plating apparatus 1 will be discussed. The plating method performed by plating apparatus 1 includes a plating processing upon the aforementioned substrate W. The plating processing is performed by the plating device 5. An operation of the plating device 5 is controlled by the controller 3.

Figure 5:
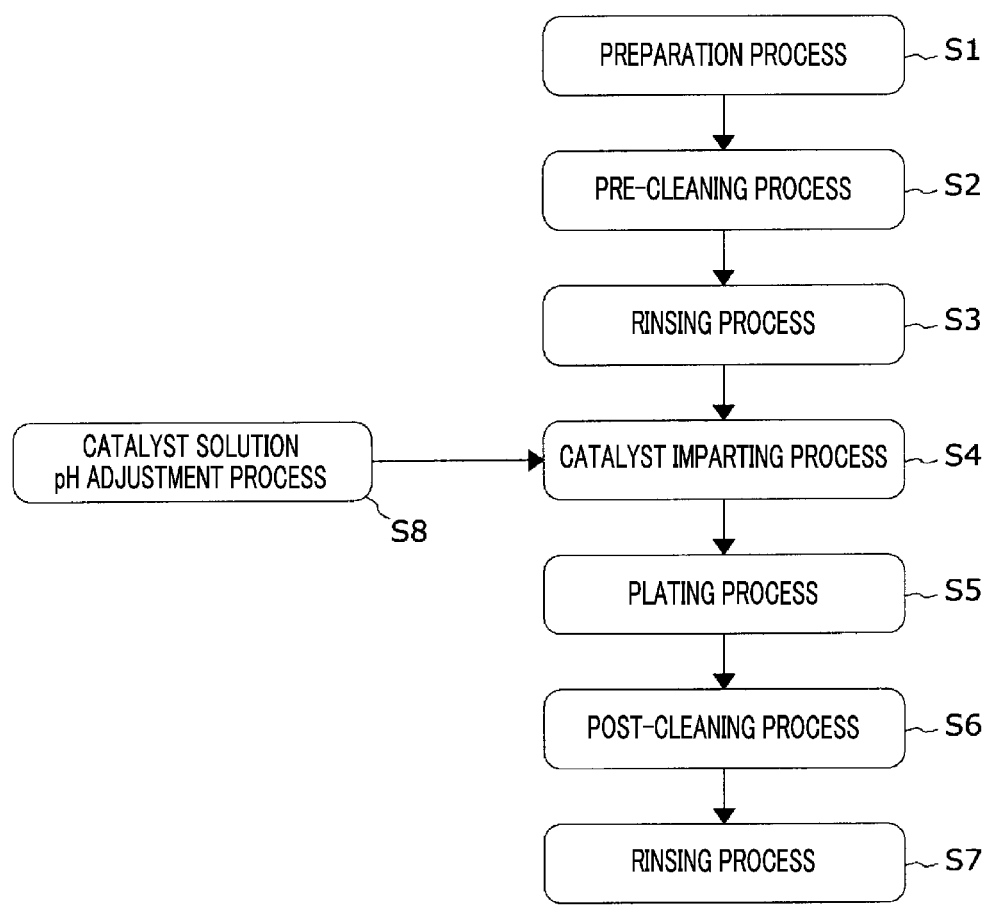
FIG. 5 is a flowchart illustrating the plating method according to the exemplary embodiment.
Figure 6A:
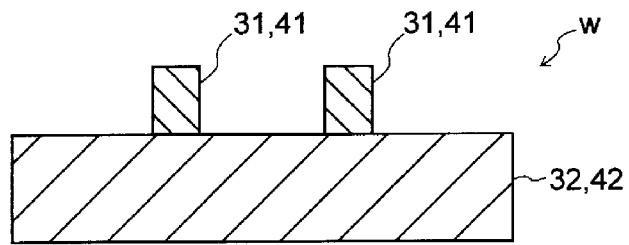
FIG. 6A to FIG. 6B are schematic cross sectional views illustrating the plating method according to the exemplary embodiment.
Figure 6B:
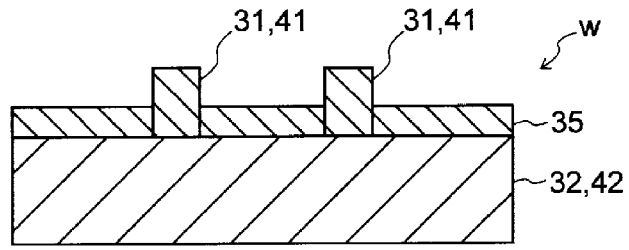

First, the substrate W having the non-plateable material portion 31 and the plateable material portion 32 formed on the surface thereof is prepared by performing the above-described method of FIG. 4A to FIG. 4E (preparation process: process S1 of FIG. 5) (see FIG. 6A).

The prepared substrate W is then carried into the plating device 5 and is held by the substrate holding unit 52 (see FIG. 2). In the meanwhile, the controller 3 controls the elevating device 58 to move the cup 57 down to a preset position. Then, the controller 3 controls the transfer device 222 to place the substrate W on the substrate holding unit 52. The substrate W is horizontally placed on the turntable 522 while its periphery portion is held by the chuck 523.

Then, the substrate W held by the substrate holding unit 52 is cleaned (pre-cleaning process: process S2 of FIG. 5). At this time, while controlling the driving unit 524 to rotate the substrate W held by the substrate holding unit 52 at a preset speed, the controller 3 controls the cleaning liquid supply unit 55b to locate the nozzle 551b at a position above the substrate W and to supply the cleaning liquid N2 onto the substrate W from the nozzle 551b. The cleaning liquid N2 supplied onto the substrate W is diffused on the surface of the substrate W by a centrifugal force which is caused by the rotation of the substrate W. As a result, a deposit or the like adhering to the substrate W is removed from the substrate W. The cleaning liquid N2 scattered from the substrate W is drained through the cup 57.

Subsequently, the substrate W after being cleaned is rinsed (rinsing process: process S3 of FIG. 5). At this time, while controlling the driving unit 524 to rotate the substrate W held by the substrate holding unit 52 at a preset speed, the controller 3 controls the rinse liquid supply unit 55c to locate the nozzle 551c at a position above the substrate W and to supply the rinse liquid N3 onto the substrate W from the nozzle 551c. The rinse liquid N3 supplied onto the substrate W is diffused on the surface of the substrate W by the centrifugal force which is caused by the rotation of the substrate W. As a result, the cleaning liquid N2 remaining on the substrate W is washed away. The rinse liquid N3 scattered from the substrate W is drained through the cup 57.

Thereafter, a catalyst imparting processing is performed on the substrate W (catalyst imparting process: process S4 of FIG. 5). At this time, while controlling the driving unit 524 to rotate the substrate W held by the substrate holding unit 52 at a preset speed, the controller 3 controls the catalyst solution supply unit 55a to locate the nozzle 551a at a position above the substrate W and to supply the catalyst solution N1 onto the substrate W from the nozzle 551a. The catalyst solution N1 supplied onto the substrate W is diffused on the surface of the substrate W by the centrifugal force which is caused by the rotation of the substrate W. The catalyst solution N1 scattered from the substrate W is drained through the cup 57.

In the present exemplary embodiment, the pH of the catalyst solution N1 is previously adjusted (catalyst solution pH adjustment process: process S8 of FIG. 5). To be specific, the pH of the catalyst solution N1 is adjusted such that the plating layer 35 is suppressed from being precipitated on the non-plateable material portion 31 while being facilitated to be precipitated on the plateable material portion 32. By way of example, in case that the non-plateable material portion 31 is mainly made of $SiO_2$ and the plateable material portion 32 is mainly made of SiN, the pH of the catalyst solution N1 is adjusted to be in a range from 2 to 3. Accordingly, in the catalyst imparting process (process S4 of FIG. 5), the catalyst such as Pd is allowed to easily adhere to the plateable material portion 32 without being attached to the non-plateable material portion 31. Thus, until the plating process (process S5 of FIG. 5) is performed after the catalyst imparting process (process S4 of FIG. 5), it is possible to perform a processing (for example, a heat treatment) for improving the adhesivity between the catalyst and the plateable material portion 32.

Accordingly, the catalyst is selectively imparted to the plateable material portion 32 of the substrate W, so that the metal film having catalytic activity is formed on the plateable material portion 32. Meanwhile, the catalyst is not substantially imparted to the non-plateable material portion 31 of the substrate W, which is mainly made of $SiO_2$, so that the metal film having the catalytic activity is not formed at this non-plateable material portion 31. By way of example, the metal having such catalytic activity may include, but not limitation, an iron group element (Fe, Co, Ni), a platinum metal element (Ru, Rh, Pd, Os, Ir, Pt), Cu, Ag or Au. Each of these metals have high adsorption property to the material (e.g., SiN) forming the plateable material portion 32, whereas each of these metals is difficult to adsorb with respect to the material (e.g., $SiO_2$) forming the non-plateable material portion 31. Further, as stated above, the pH of the catalyst solution N1 is previously adjusted such that the plating layer 35 is suppressed from being precipitated on the non-plateable material portion 31 while being facilitated to be precipitated on the plateable material portion 32. Thus, a plating metal can be selectively precipitated on the plateable material portion 32. The catalyst solution N1 may contain the Pd catalyst in the form of nanoparticles, the dispersant composed of polyvinylpyrrolidone (PVP), and the aqueous solution. Further, the catalyst solution N1 may contain an adsorption promoter which promotes the adsorption of the metal having the catalytic activity.

Then, the plating processing is performed on the substrate W, and the plating is selectively performed on the plateable material portion 32 (plating process: process S5 of FIG. 5). Resultantly, the plating layer 35 is formed on the plateable material portion 32 (see FIG. 6B). The plating layer 35 is formed at a portion of the plateable material portion 32 where the non-plateable material portion 31 is not covered. At this time, while controlling the driving unit 524 to rotate the substrate W held by the substrate holding unit 52 at a preset speed or while maintaining the substrate W held by the substrate holding unit 52 stopped, the controller 3 controls the plating liquid supply unit 53 to locate the nozzle 531 at a position above the substrate W and to supply the plating liquid M1 onto the substrate W from the nozzle 531. Accordingly, the plating metal is selectively precipitated on the plateable material portion 32 (specifically, on the metal film, having the catalytic activity, formed on the surface of the plateable material portion 32) of the substrate W, so that the plating layer 35 is obtained. Meanwhile, since the catalyst is not substantially imparted to the non-plateable material portion 31 of the substrate W as stated above, the metal film having the catalytic activity is not formed on the non-plateable material portion 31. As a result, the plating metal is not substantially precipitated on the non-plateable material portion 31 and no plating layer 35 is formed thereon.

After the plating processing as described above is completed, the substrate W held by the substrate holding unit 52 is cleaned (post-cleaning process: process S6 of FIG. 5). At this time, while controlling the driving unit 524 to rotate the substrate W held by the substrate holding unit 52 at a preset speed, the controller 3 controls the cleaning liquid supply unit 55b to locate the nozzle 551b at the position above the substrate W and to supply the cleaning liquid N2 onto the substrate W from the nozzle 551b. The cleaning liquid N2 supplied onto the substrate W is diffused on the surface of the substrate W by the centrifugal force which is caused by the rotation of the substrate W. Accordingly, the abnormal plating film or the reaction by-product adhering to the substrate W is removed from the substrate W. The cleaning liquid N2 scattered from the substrate W is drained through the cup 57.

Then, while controlling the driving unit 524 to rotate the substrate W held by the substrate holding unit 52 at a preset speed, the controller 3 controls the rinse liquid supply unit 55c to locate the nozzle 551c at the position above the substrate W and to supply the rinse liquid N3 onto the substrate W from the nozzle 551c (rinsing process: process S7 of FIG. 5). Accordingly, the plating liquid M1, the cleaning liquid N2 and the rinse liquid N3 on the substrate W are scattered from the substrate W by the centrifugal force which is caused by the rotation of the substrate W, and are drained through the cup 57.

Thereafter, the substrate W on which the plating layer 35 is formed is carried out of the plating device 5. At this time, the controller 3 controls the transfer device 222 to take out the substrate W from the plating device 5 and place the taken-out substrate W in the delivery unit 214. Then, the controller 3 controls the transfer device 213 to take out the substrate W placed in the delivery unit 214 and to carry the substrate W into the carrier C in the placing section 211.

Then, the substrate W is etched by using the plating layer 35 as a hard mask layer.

Figure 7A:
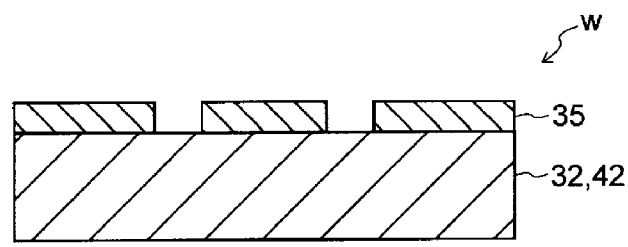
FIG. 7A to FIG. 7C are schematic cross sectional views illustrating a method of processing the substrate on which the plating layer is formed by the plating method according to the present exemplary embodiment.

In this case, the non-plateable material portion 31 is first removed selectively from the substrate W which is taken out of the plating device 5 (FIG. 7A). Meanwhile, the plating layer 35 formed on the plateable material portion 32 remains without being removed.

Figure 7B:
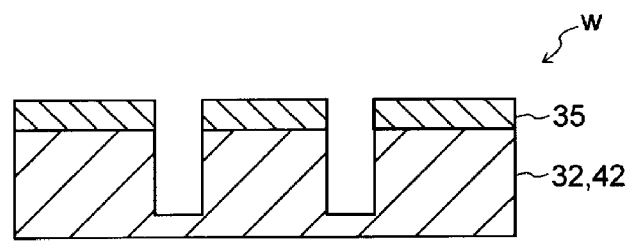

Subsequently, as shown in FIG. 7B, the base member 42 made of the plateable material portion 32 is dry-etched by using the plating layer 35 as a hard mask. Accordingly, the portion of the base member 42 which is not covered with the plating layer 35 is etched to a preset depth, and recesses having a pattern shape are formed.

Figure 7C:
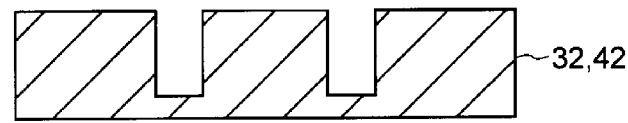

Afterwards, by removing the plating layer 35 through a wet cleaning method, the base member 42 provided with the recesses having the pattern shape is obtained, as illustrated in FIG. 7C. Since the plating layer 35 can be removed by the wet cleaning method, it is easy to remove the plating layer 35. An acidic solvent is employed as a chemical liquid for this wet cleaning method.

As stated above, according to the present exemplary embodiment, in the process of imparting the catalyst such as Pd, the pH of the catalyst solution N1 is previously adjusted such that the plating layer 35 is suppressed from being precipitated on the non-plateable material portion 31 while being facilitated to be precipitated on the plateable material portion 32. Accordingly, the catalyst in the catalyst solution N1 does not adhere to the non-plateable material portion 31 but selectively adheres to the plateable material portion 32 from the beginning. In this case, after the catalyst imparting process (process S4 of FIG. 5) and before the plating process (process S5 of FIG. 5), it is possible to perform a processing of improving the adhesivity between the catalyst and the plateable material portion 32.

The reason why the catalyst in the catalyst solution N1 can be selectively attached to the plateable material portion 32 by adjusting the pH of the catalyst solution N1 is deemed to be as follows. That is, the non-plateable material portion 31 and the plateable material portion 32 of the substrate W have different surface potentials and different isoelectric points. In the catalyst imparting process, electric charges in the surface of the substrate W change depending on the pH of the catalyst solution N1. By way of example, the $SiO_2$ forming the non-plateable material portion 31 and the SiN forming the plateable material portion 32 tend to show the same pH dependency. That is, in both the $SiO_2$ and the SiN, each of the electric charges change from negative to positive as the pH of the catalyst solution N1 changes from the alkali toward the acid. Since, however, the isoelectric points of the $SiO_2$ and the SiN are different, the electric charges of the $SiO_2$ and the SiN become opposite in a certain pH range. That is, in a pH range between the isoelectric points of the $SiO_2$ and the SiN, the electric charges of the $SiO_2$ and the SiN have the opposite polarities. Since the isoelectric point of the $SiO_2$ is located at a more acidic side than the isoelectric point of the SiN, the electric charges of the $SiO_2$ become negative whereas the electric charges of the SiN become positive in the pH range between the isoelectric points of the $SiO_2$ and the SiN. This pH range is approximately a range from pH 2 to pH 3. In this range, if a catalyst metal particle having a negative electric charge is used, it is electrically attracted to the SiN which is positively charged, so that the catalyst metal particle can be easily attached to the SiN. Meanwhile, the catalyst metal particle having the negative charge is electrically repellent against the $SiO_2$ which is negatively charged. Thus, the catalyst metal particle is difficult to attach to the $SiO_2$. For this reason, by adjusting the pH of the catalyst solution N1 to be in the pH range between the isoelectric points of the $SiO_2$ and the SiN, it is possible to allow the catalyst in the catalyst solution N1 to adhere to the SiN selectively from the beginning. Desirably, by using a pH range where the catalyst metal particle is most negatively charged, the best effect can be achieved.

Further, according to the present exemplary, even if a minute impurity (or lattice defect) exists on the part of the non-plateable material portion 31, the adsorption of the catalyst to this impurity is suppressed. Accordingly, in the plating process, the metal particle M in the plating liquid M1 can be suppressed from being adsorbed to the impurity on the non-plateable material portion 31, so that the growth of the plating layer 35 from the catalyst on the impurity is suppressed. As a result, after the plating processing, the plating layer is not formed on the non-plateable material portion 31 where the plating layer is not intended to be formed, so that the generation of the defect on the non-plateable material portion 31 can be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plating method, comprising:
preparing a substrate having a non-plateable material portion and a plateable material portion formed on a surface thereof;
imparting a catalyst selectively to the plateable material portion by supplying a catalyst solution onto the substrate; and
forming a plating layer selectively on the plateable material portion by supplying a plating liquid onto the substrate,
wherein a pH of the catalyst solution is previously adjusted to be in a pH range between isoelectric points of a main component of the non-plateable material portion and a main component of the plateable material portion such that the plating layer is suppressed from being precipitated on the non-plateable material portion while being facilitated to be precipitated on the plateable material portion.

2. A plating method, comprising:
preparing a substrate having a non-plateable material portion and a plateable material portion formed on a surface thereof;
imparting a catalyst selectively to the plateable material portion by supplying a catalyst solution onto the substrate; and
forming a plating layer selectively on the plateable material portion by supplying a plating liquid onto the substrate,
wherein a pH of the catalyst solution is previously adjusted such that the plating layer is suppressed from being precipitated on the non-plateable material portion while being facilitated to be precipitated on the plateable material portion, and
wherein the non-plateable material portion is made of $SiO_2$ as a main component, the plateable material portion is made of SiN as a main component, and the pH falls within a range from 2 to 3.

3. The plating method of claim 1, wherein the substrate includes a base member made of the plateable material portion and a core member which is protruded from the base member and is made of the non-plateable material portion.

* * * * *